US011537054B1

(12) United States Patent
Liao et al.

(10) Patent No.: US 11,537,054 B1
(45) Date of Patent: Dec. 27, 2022

(54) METHODS AND APPARATUS FOR REDUCING HYDROGEN PERMEATION FROM LITHOGRAPHIC TOOL

(71) Applicant: TAIWAN SEMICONDUCTOR MANUFACTURING COMPANY, LTD., Hsinchu (TW)

(72) Inventors: Chi-Hung Liao, Sanchong (TW); Po-Ming Shih, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/351,964

(22) Filed: Jun. 18, 2021

(51) Int. Cl.
*G03F 7/20* (2006.01)
*G03F 1/22* (2012.01)

(52) U.S. Cl.
CPC .......... *G03F 7/70916* (2013.01); *G03F 1/22* (2013.01); *G03F 7/70033* (2013.01); *G03F 7/70525* (2013.01); *G03F 7/70533* (2013.01)

(58) Field of Classification Search
CPC .... G03F 7/70916; G03F 1/22; G03F 7/70033; G03F 7/70525; G03F 7/70533; G03F 7/707; G03F 7/70875; H01L 21/67115; H01L 21/67253
See application file for complete search history.

(56) References Cited

U.S. PATENT DOCUMENTS

| | | | | |
|---|---|---|---|---|
| 3,763,428 A | * | 10/1973 | Preist | G01N 15/0266 |
| | | | | 73/28.02 |
| 4,388,411 A | * | 6/1983 | Lovelock | G01N 33/0026 |
| | | | | 422/90 |
| 8,796,666 B1 | | 8/2014 | Huang et al. | |
| 9,093,530 B2 | | 7/2015 | Huang et al. | |
| 9,184,054 B1 | | 11/2015 | Huang et al. | |
| 9,256,123 B2 | | 2/2016 | Shih et al. | |
| 9,529,268 B2 | | 12/2016 | Chang et al. | |
| 9,548,303 B2 | | 1/2017 | Lee et al. | |
| 9,618,837 B2 | | 4/2017 | Lu et al. | |
| 9,869,928 B2 | | 1/2018 | Huang et al. | |
| 9,869,934 B2 | | 1/2018 | Huang et al. | |
| 9,869,939 B2 | | 1/2018 | Yu et al. | |
| 2008/0011967 A1 | * | 1/2008 | Van Herpen | G03F 7/70916 |
| | | | | 250/492.2 |
| 2017/0363974 A1 | * | 12/2017 | Yoo | G03F 7/707 |

* cited by examiner

Primary Examiner — Mesfin T Asfaw
(74) Attorney, Agent, or Firm — McDermott Will & Emery, LLP

(57) ABSTRACT

An apparatus for reducing hydrogen permeation of a mask is provided when generating extreme ultraviolet (EUV) radiation. The apparatus includes a mask stage configured to hold the mask, a hydrogen dispensing nozzle configured to eject hydrogen below the mask, and a trajectory correcting assembly. The trajectory correcting assembly includes a correcting nozzle and a gas flow detector. The correcting nozzle is configured to dispense at least one flow adjusting gas to adjust a trajectory of the hydrogen away from the mask to reduce hydrogen permeation at an edge of the mask. The gas flow detector is configured to measure a variation of an airflow of the hydrogen adjusted by the at least one flow adjusting gas.

20 Claims, 16 Drawing Sheets

US 11,537,054 B1

METHODS AND APPARATUS FOR REDUCING HYDROGEN PERMEATION FROM LITHOGRAPHIC TOOL

BACKGROUND

Functional density, i.e., number of interconnected devices per chip, of semiconductor integrated circuits (ICs) has increased over the years. This increase in functional density has been achieved by reducing the size of individual devices on the chip. Semiconductor manufacturing techniques such as photolithography needed to continue this decreasing trend in size of devices are met by decreasing the wavelength of light used in photolithography to extreme ultraviolet (EUV) wavelengths.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
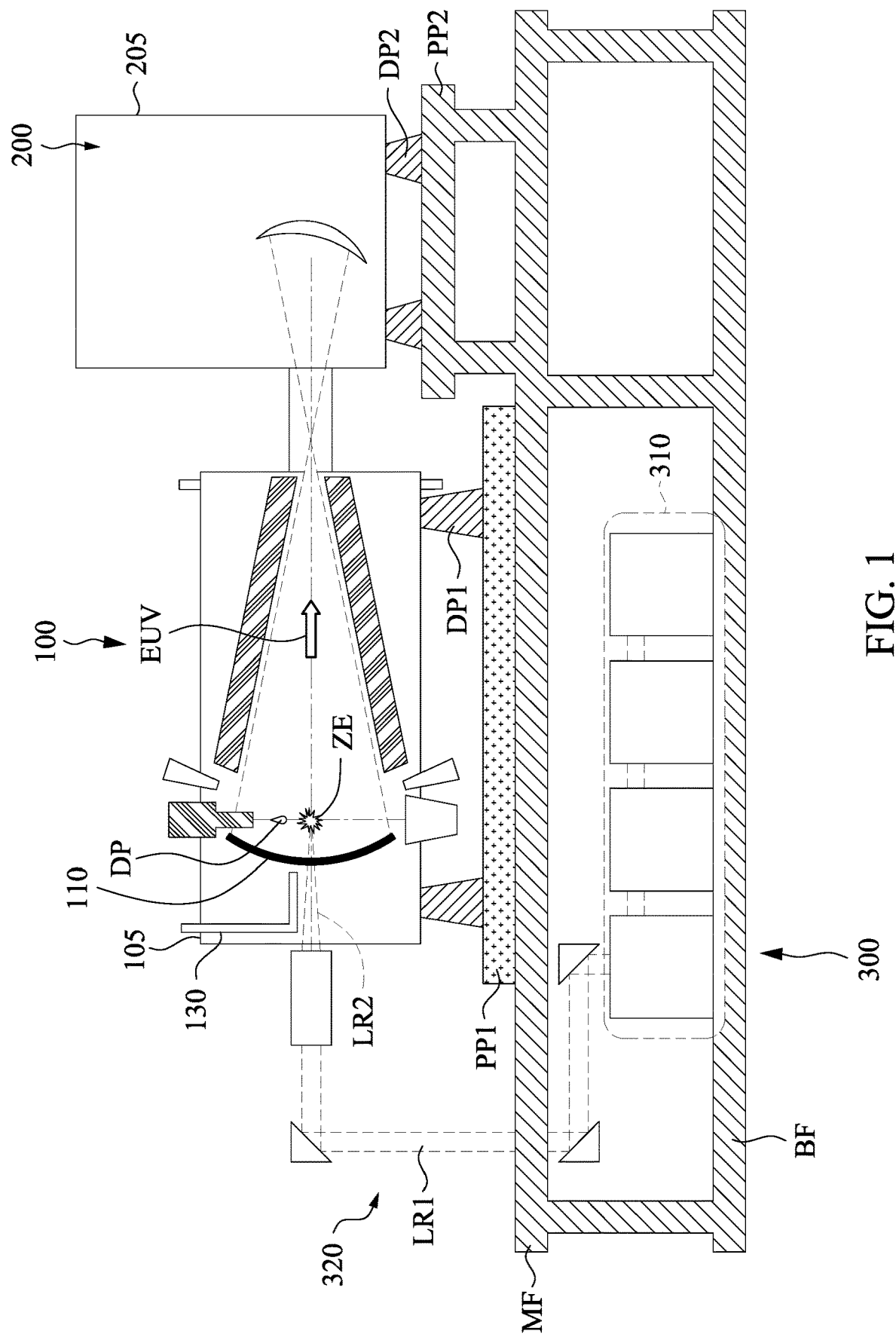
FIG. 1 is a schematic view of an EUV lithography system, in accordance with embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

The present disclosure is generally related to extreme ultraviolet (EUV) lithography system and methods. More particularly, it is related to apparatuses and methods for cleaning a reticle holder used to secure a reticle in an EUVL exposure tool.

Because gas molecules absorb EUV light, the lithography system for the EUV lithography patterning is maintained in a vacuum or a low pressure environment to avoid EUV intensity loss and to prevent adverse effects of ionized gases on the wafer on which EUVL is being performed, the various layers present on the wafer, and the optical components used in the EUVL exposure tool. Therefore, an electrostatic reticle holder is used in EUVL systems to secure reticles. However, because of the force with which the reticle holder secures the reticle, contaminant particles on the reticle holder can damage the reticle holder as well as the reticle. Moreover, such contaminant particles on the reticle holder can cause minute distortions in the reticle surface, resulting in distortion in the pattern being produced on the wafer.

To suppress particles or contaminant from accumulating on the reticle or the reticle holder, a gas flow, such as a hydrogen gas flow, is provided to the reticle holder. During an extreme ultraviolet (EUV) lithography process, however, the hydrogen flow drifts towards a surface of the reticle due to its light molecular weight. The drifted hydrogen accumulates/deposits at an edge of the reticle, permeating into the space between the reticle and a covering film. This hydrogen permeation (also called a "blister problem") onto the reticle results in bubbles at the edge of the reticle and causes the covering film to peel off. Undesirable particles generated by the peeled-off film can interfere with the further processing steps. Therefore, it is beneficial to prevent the undesirable particles caused by hydrogen permeation as a part of the lithographic process.

One of the objectives of the present disclosure is directed to cleaning the reticle holder while reducing down time of the exposure tool and reducing damage to reticle holder and the reticle.

FIG. 1 is a schematic view of an EUV lithography system with a laser produced plasma (LPP) based EUV radiation source, in accordance with some embodiments of the present disclosure. The EUV lithography system includes an EUV radiation source 100 to generate EUV radiation, an exposure tool 200, such as a scanner, and an excitation laser source 300. As shown in FIG. 1, in some embodiments, the EUV radiation source 100 and the exposure tool 200 are installed on a main floor MF of a clean room, while the excitation laser source 300 is installed in a base floor BF located under the main floor. Each of the EUV radiation source 100 and the exposure tool 200 are placed over pedestal plates PP1 and PP2 via dampers DP1 and DP2, respectively. The EUV radiation source 100 and the exposure tool 200 are coupled to each other by a coupling mechanism, which may include a focusing unit.

The lithography system is an EUV lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength in a range from about 1 nm to about 100 nm. In one particular example, the EUV radiation source 100 generates EUV light with a wavelength centered at about 13.5 nm.

The exposure tool 200 includes various reflective optical components, such as convex/concave/flat mirrors, a mask holding mechanism including a mask stage, and wafer holding mechanism. The exposure tool 200 further includes an exposure chamber 205 that encloses all of the optical components, mask holding mechanism and wafer holding mechanism of the exposure tool 200. The exposure chamber 205 provides a vacuum environment for the exposure tool 200 to avoid loss of intensity of the EUV radiation because of absorption from gases.

Figure 2:
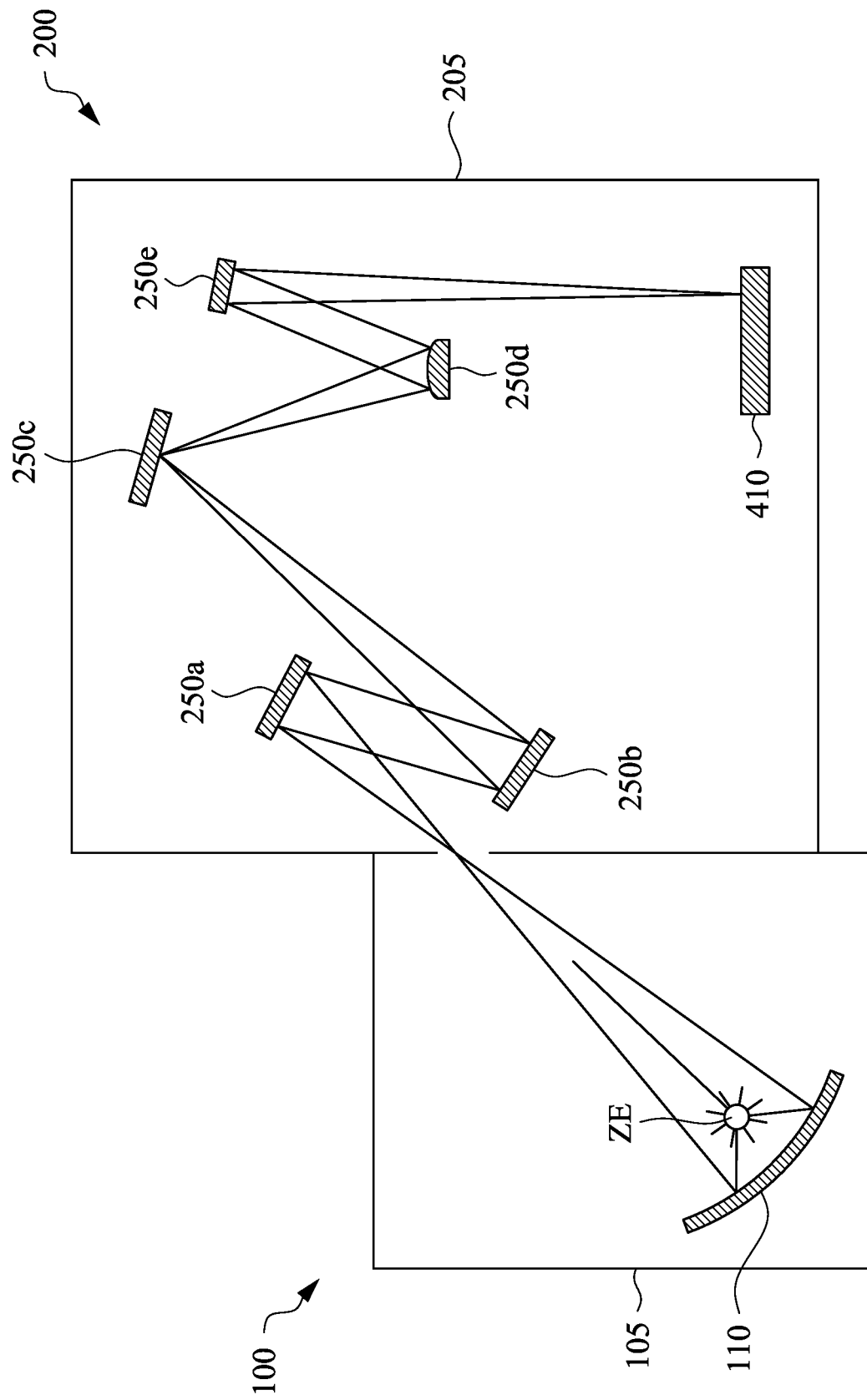
FIG. 2 is a schematic diagram of a detail of an extreme ultraviolet lithography tool relating to embodiments of the present disclosure.

FIG. 2 is a simplified schematic diagram of a detail of an extreme ultraviolet lithography tool according to an embodiment of the disclosure showing the exposure of the photoresist coated substrate 410 with a patterned beam of EUV light. The exposure device 200 is an integrated circuit lithography tool such as a stepper, scanner, step and scan system, direct write system, device using a contact and/or proximity mask, etc. The exposure device 200 is provided with one or more optics 250*a*, 250*b*, for example, to illuminate a patterning optic 250, such as a reticle, with a beam of EUV light, to produce a patterned beam, and one or more reduction projection optics 250*c*, 250*d*, for projecting the patterned beam onto the substrate 410. A mechanical assembly (not shown) may be provided for generating a controlled relative movement between the substrate 410 and patterning optic 250. As further shown in FIG. 2, the EUVL tool includes an EUV light source 100 including an EUV light radiator ZE emitting EUV light in a chamber 105 that is reflected by a collector 110 along a path into the exposure device 200 to irradiate the substrate 410.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is not meant to be limited to components which operate solely within one or more specific wavelength range(s), such as at the EUV output light wavelength, the irradiation laser wavelength, a wavelength suitable for metrology or any other specific wavelength.

In various embodiments of the present disclosure, the photoresist coated substrate 410 is a semiconductor wafer, such as a silicon wafer or other type of wafer to be patterned.

Figure 3:
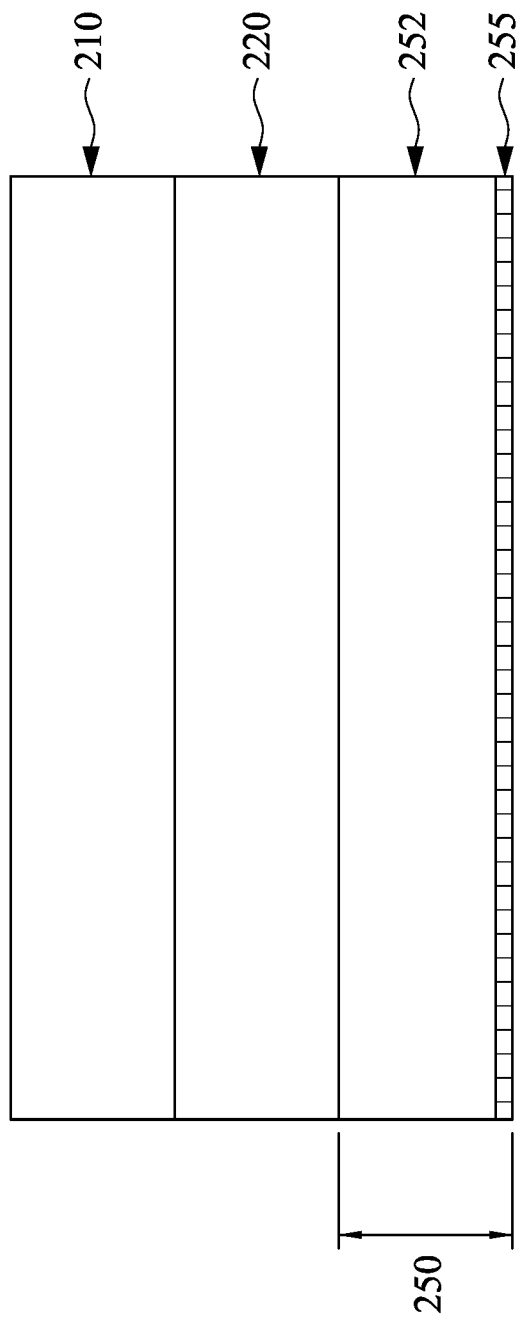
FIG. 3 schematically illustrates a mask holding mechanism relating to some embodiments of the present disclosure.

FIG. 3 schematically illustrates a mask holding mechanism in accordance with an embodiment of the present disclosure. The following description refers to FIG. 2 and FIG. 3. The EUV radiation EUV generated by the EUV radiation source 100 is guided by the reflective optical components onto a mask 250 secured on the mask stage 210. In some embodiments, the mask stage 210 includes an electrostatic reticle holder 220 (interchangeably referred to herein as electrostatic chuck or e-chuck) to secure the mask 250.

In the present disclosure, the terms mask, photomask, and reticle are used interchangeably. In the present embodiment, the reticle 250 is a reflective mask. In an embodiment, the reticle 250 includes a substrate 252 formed of a suitable material, such as a low thermal expansion material or fused quartz. In various embodiments, the substrate material includes $TiO_2$ doped $SiO_2$, or other suitable materials with low thermal expansion. The mask 250 includes multiple reflective multiple layers (ML) (not shown) deposited on the substrate 252. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask 250 may further include a capping layer (not shown), such as ruthenium (Ru), disposed on the ML for protection. The mask 250 further includes an absorption layer 255, such as a tantalum boron nitride (TaBN) layer, deposited over the ML. The absorption layer 255 is patterned to define a layer of an integrated circuit (IC). Alternatively, another reflective layer may be deposited over the ML and is patterned to define a layer of an integrated circuit, thereby forming an EUV phase shift mask.

Figure 4A:
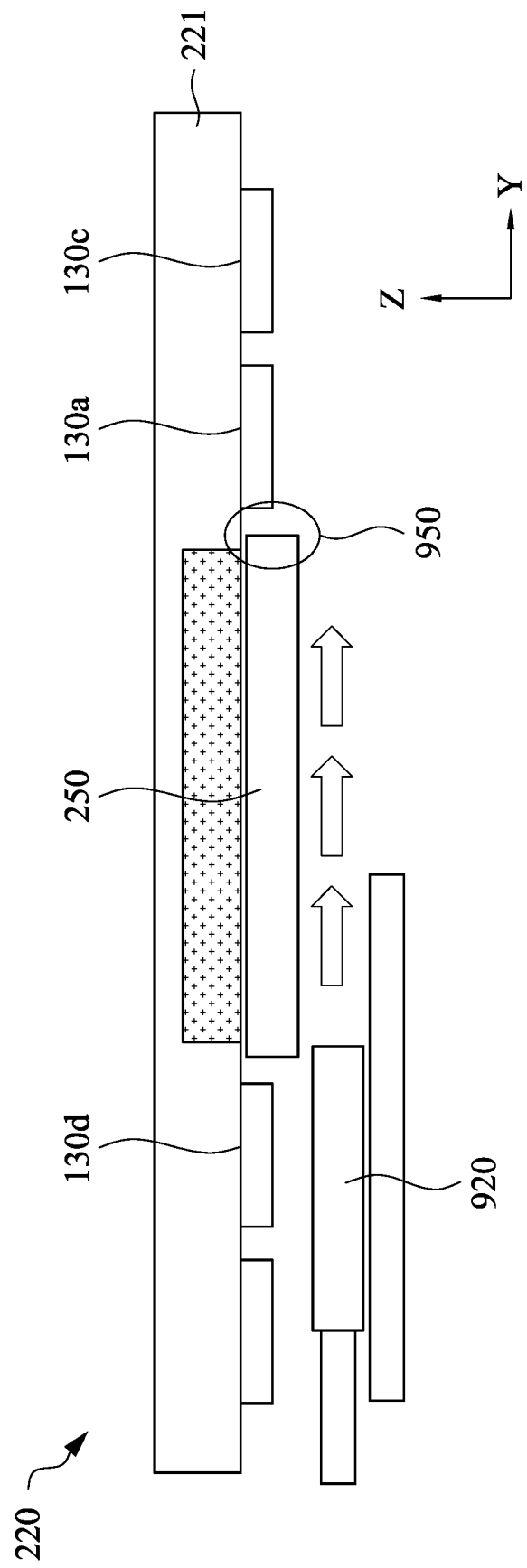
FIG. 4A illustrates a cross-sectional schematic view of a reticle holder.
Figure 4C:
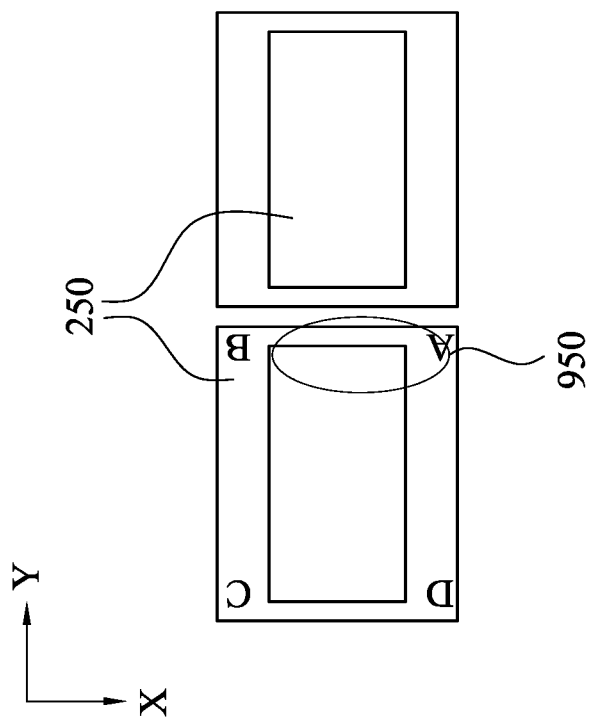
FIG. 4C illustrates other plan views of hydrogen permeation at an edge of the reticle.
Figure 4B:
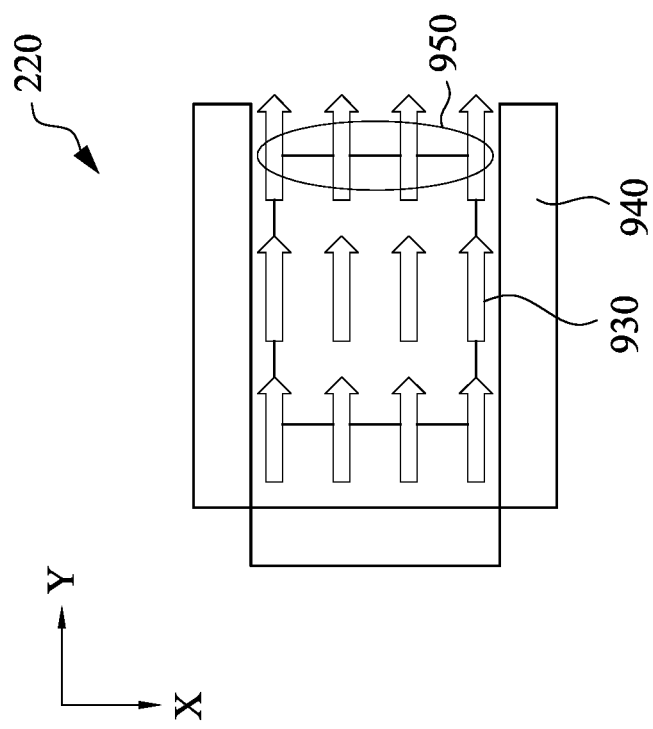
FIG. 4B illustrates a plan view of the reticle holder.

FIG. 4A illustrates a cross-sectional schematic view of a reticle holder 220. FIG. 4B illustrates a plan view of the reticle holder 220. FIG. 4C illustrates other plan views of hydrogen permeation at an edge 950 of the reticle 250. The reticle 250 and electrostatic chuck 221 are positioned such that radiation EUV supplied from the EUV radiation source is in focus when it arrives at the surface of the semiconductor workpiece. A reticle mini environment (RME) provides contamination and environmental control in semiconductor manufacturing operation by an isolation of equipment and processes. The RME is an enclosure configured to separate an operating personnel from the equipment, thereby maintaining a locally controlled process environments. The RME allows an access to the equipment for loading and maintenance. In some embodiments, a dummy reticle mini environment (RME) 940 may be constructed without any internal components in the structure of the RME. As the dummy RME allows an access to the equipment for loading and maintenance, in the present configuration, a Y-nozzle 920 is mounted within the dummy reticle mini environment (RME) 940, and ejects hydrogen 930 along the y-axis. The y-axis is perpendicular to the x-axis of the reticle, an axis along the motion by the hydrogen and perpendicular to the z-axis, which is the axis substantially normal to the surface of the reticle.

A number of sensors 130 may be disposed on a bottom surface of the electrostatic chuck 221. The sensors 130 are positioned to be proximate to the reticle 250 during operation, for example near the edge of the reticle 250. The sensors 130 may be fixedly mounted on the electrostatic chuck 221 and may be used to evaluate and/or optimize imaging performance of the EUV illumination tool. One or more sensors 130 may include a lower plate that is transparent to radiation, such as radiation in the EUV wavelength, or may include a pattern of transparent portions and opaque portions. The sensor 130 may include an optical element, such as a fiber optic plate or micro lens array, which is suitable to direct or focus the received radiation to a transducer. The transducer may be a device to convert radiation to an electric signal, such as a photodiode, a CCD camera, or a CMOS camera. The output of the transducer may be used to control, calibrate, or optimize the operation of the EUV illumination tool.

In some embodiments, the sensors 130a may be transmission image sensors (TIS). A TIS sensor is used to measure the position of a projected aerial image of a mask pattern on the reticle 250. The projected image may be a line pattern with a line having comparable wavelength to the wavelength of the radiation. The measurement of the TIS sensors 130a may be used to measure the position of the mask with respect to the reticle stage in six degrees of freedom, e.g., three degrees of freedom in translation and three degrees of freedom in rotation. Additionally, magnification and scaling of the projected pattern may also be measured by the TIS sensors 130a. The TIS sensors 130a are capable of measuring pattern positions, influences of illumination settings, such as sigma, numerical aperture of lens. The TIS sensors 130a may be used to align the reticle 250 with the substrate, focus the EUV radiation to a target region on the substrate, measure performance of the EUV illumination tool, and/or measure optical properties, such as pupil shape, coma, spherical aberration, astigmatism, and field curvature.

In some embodiments, the sensor 130c may be a spot sensor configured to measure a dose of EUV radiation at the substrate level. The measured EUV radiation by the spot sensor 130c at the substrate level can be used to calculate the EUV radiation absorbed by mirrors in the path of the EUV radiation 108 for compensating the effects of EUV radiation loss, which may improve optical performance of the EUV illumination tool.

In some embodiments, the sensor 130d is an integrated lens interferometer at scanner (ILIAS). An ILIAS sensor is an interferometric wave front measurement device that performs static measurement on lens aberrations up to a high order. The ILIAS sensor 130d may be used to measure wavefront errors in the EUV radiation 108.

It should be noted that other sensors may be included in the reticle stage to achieve target functions. Different sensors may be combined into one sensor to achieve multiple functions. For example, a TIS sensor may be combined to with an ILIAS sensor to measure both projected aerial images and wavefront errors.

Figure 5A:
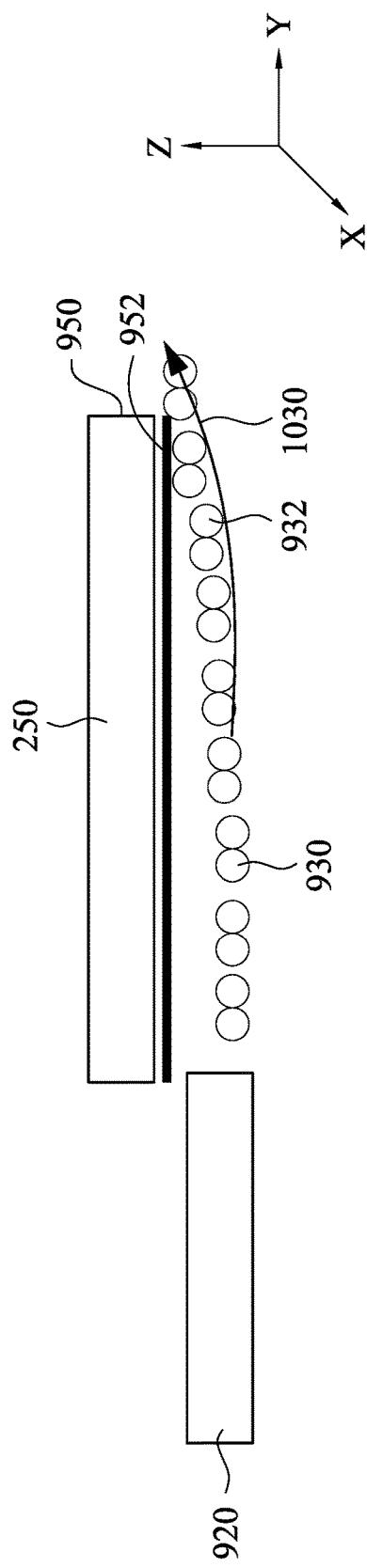
FIGS. 5A and 5B are schematic views of the trajectory of the hydrogen and a trajectory correcting assembly according to embodiments of the disclosure.

As shown in FIG. 5A, a Y-nozzle 920 is a nozzle configured to eject gas along a y-axis and perpendicular to an x-axis and a z-axis. During the EUV lithography process, the hydrogen flow 930 ejected by the Y-nozzle 920 along the y-axis drifts towards a surface of the reticle due to its light molecular weight. Because the hydrogen is lighter than air, it rises in a vertical direction relative to the air. The drifted hydrogen 932 accumulates/deposits at the edge 950 of the reticle 250, permeating into the space between the reticle and a covering film 952. This hydrogen permeation (also called a "blister problem") onto the reticle 250 results in bubbles at the edge of the reticle and causes peeling off of the covering film. Undesirable particles generated by the peeled-off film can interfere with further processing steps. Therefore it is beneficial to prevent undesirable particles caused by the hydrogen permeation as a part of the lithographic process.

Figure 5B:
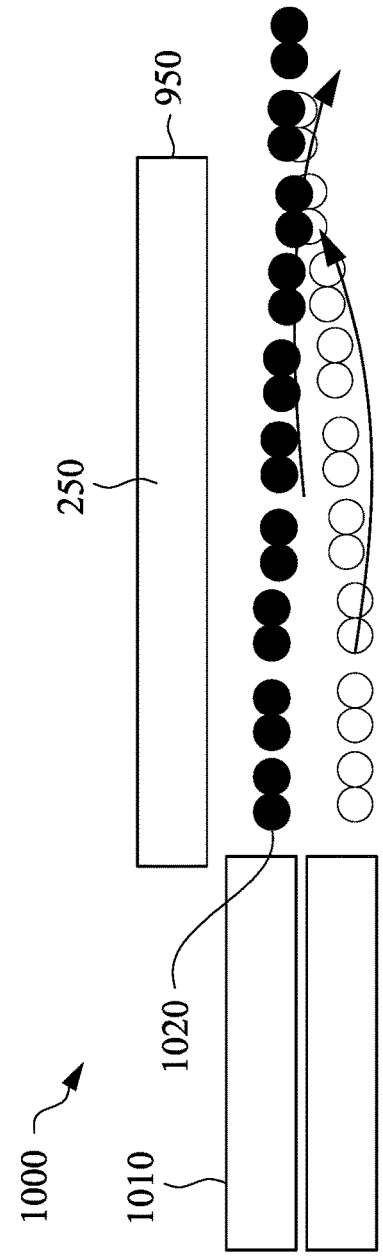

As shown in FIG. 5B, a correcting nozzle 1010 of a trajectory correcting assembly 1000 is configured to eject at least one flow adjusting gas 1020 to adjust a trajectory of the hydrogen 1030 away from the mask to reduce hydrogen permeation at the edge 950 of the reticle (mask) 250. The ability of at least one flow adjusting gas 1020 forcing the trajectory of the hydrogen 1030 away from the reticle reducing the hydrogen permeation at the edge 950 of the reticle 250 is directly proportional to a molecular weight (density, if pressurized) of the at least one flow adjusting gas 1020. In some embodiments, the at least one flow adjusting gas includes a purging gas such as, for example, helium (He), neon (Ne), argon (Ar). In some embodiments, the at least one flow adjusting gas is determined based on the molecular weight (density) by a combination of purging gases depending on the trajectory of the hydrogen 1030. As the molecular weight of the at least one flow adjusting gas 1020 is greater than molecular weight of the hydrogen flow 930, using the at least one flow adjusting gas 1020 with a high molecular weight (density) may affect the process or other components disposed in the exposure chamber 205. Thus, the molecular weight (density) of the at least one flow adjusting gas 1020 (or output pressure of the correcting nozzle 1010) is determined, in some embodiments, to be no higher than what is necessary to reduce the hydrogen permeation.

Figure 5C:
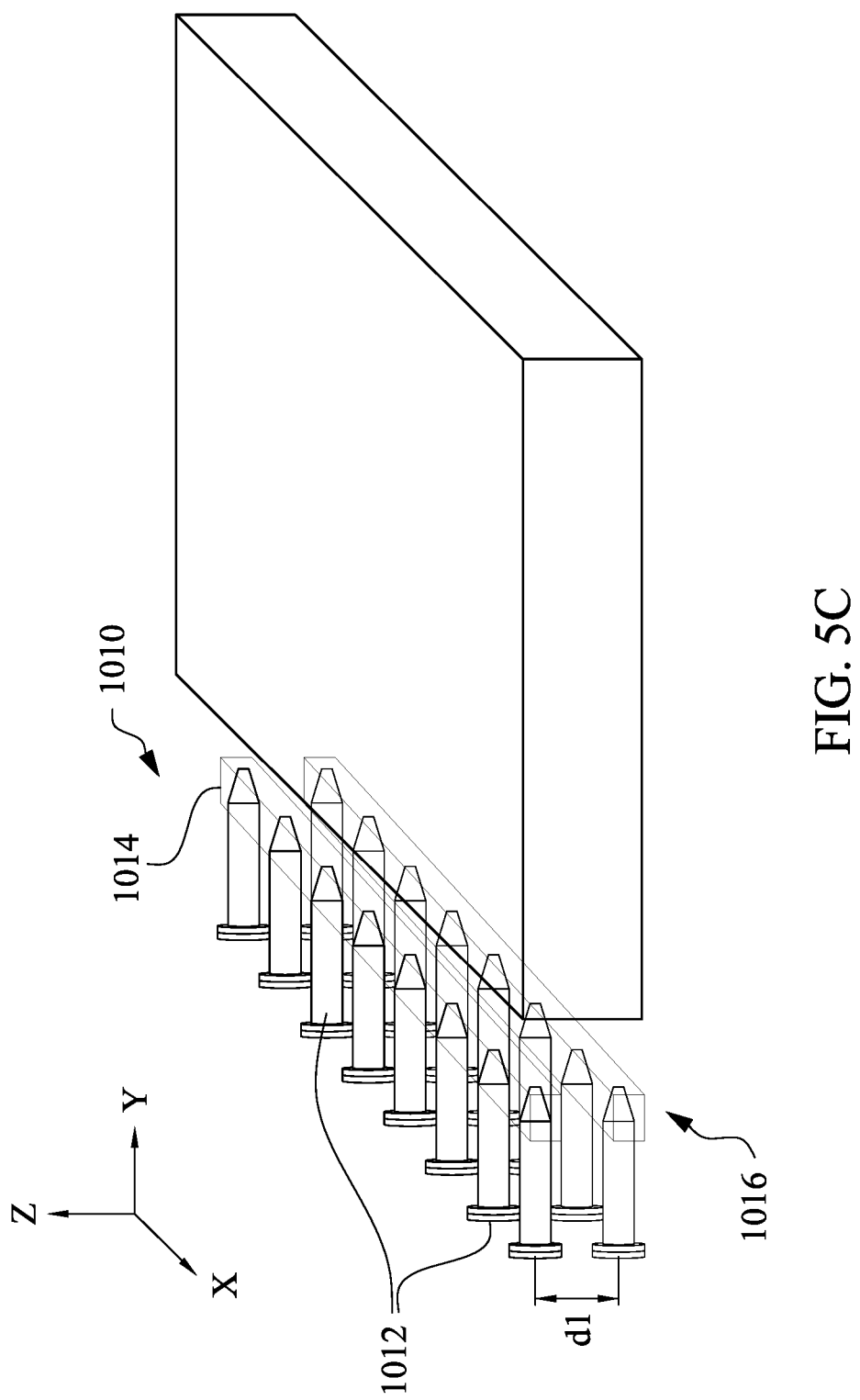
FIG. 5C illustrates a plurality of nozzles according to embodiments of the disclosure.

FIG. 5C illustrates a plurality of nozzles and a plurality of exhaust nozzles according to embodiments of the disclosure. As shown in FIG. 5C, in some embodiments, the correcting nozzle 1010 includes a plurality of nozzles 1012 arranged in the X direction. In other embodiments, the correcting nozzle 1010 is a slit shape nozzle 1014 having a smaller width in the Z direction than in the X direction. A distance dl in the Z direction between the Y-nozzle for hydrogen 1016 and the correcting nozzle 1010 (center-to-center distance) is in a range from about 1 mm to about 20 mm.

In some embodiments, the trajectory correcting assembly 1000 further includes an exhaust nozzle 1070 to adjust the trajectory of the hydrogen away from the mask thereby reducing hydrogen permeation at the edge of the reticle (mask).

Figure 5D:
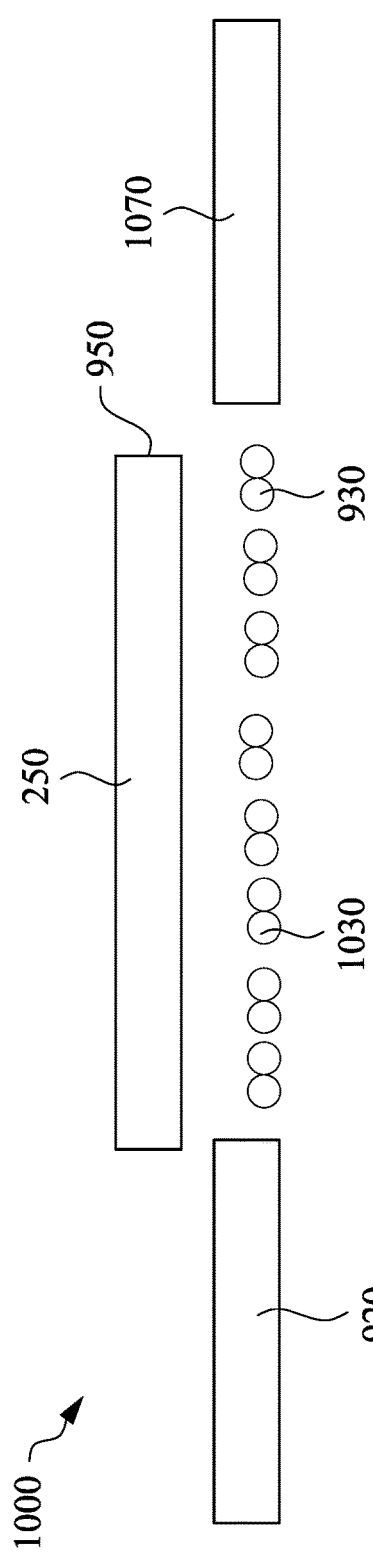
FIGS. 5D and 5E are schematic views of trajectory of the hydrogen and an exhaust nozzle according to embodiments of the disclosure.
Figure 5E:
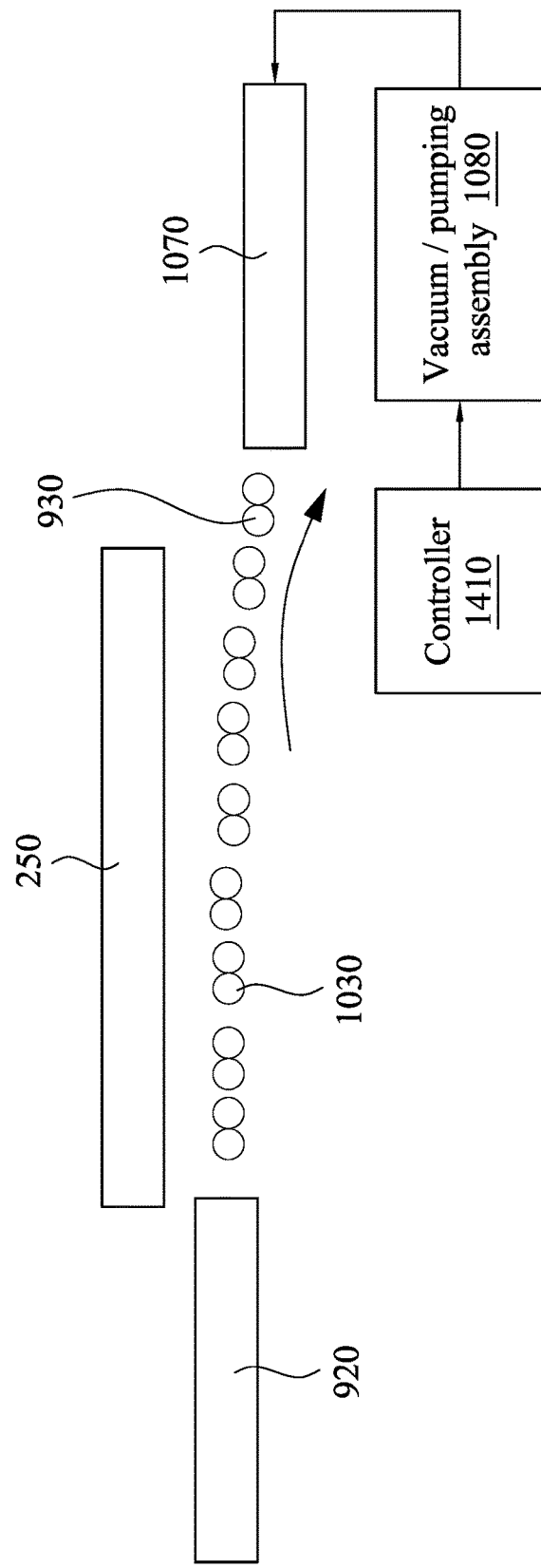

FIGS. 5D and 5E are schematic views of trajectory of the hydrogen and the exhaust nozzle 1070 according to embodiments of the disclosure. As shown in FIG. 5D, the exhaust nozzle 1070 is configured to adjust the trajectory of the hydrogen 1030 by forcibly exhausting the hydrogen 930 away from the reticle, thereby reducing the hydrogen permeation at the edge 950 of the reticle 250. In some embodiments, the exhaust nozzle 1070 is connected to the vacuum and/or pumping assembly 1080. As shown in FIG. 5E, the ability of the exhaust nozzle 1070 forcing the trajectory of the hydrogen 1030 away from the edge 950 of the reticle 250 is proportional to the exhaust pressure, which is controlled and adjusted by the controller 1410. For example, as shown in FIG. 5D, the exhaust nozzle 1070 and the Y-nozzle 920 are located at the same level/distance away from the bottom surface of the reticle 250. In some embodiments, as shown in FIG. 5E, the exhaust nozzle 1070 may be located at a greater distance than the Y-nozzle 920 further away from the bottom surface of the reticle 250 to adjust the trajectory of the hydrogen 1030 by forcibly exhausting the hydrogen 930 away from the reticle. In some embodiments, the exhaust nozzle 1070 is configured to adjust the trajectory of the hydrogen in combination with the correcting nozzle 1010 adjacent to the Y-nozzle for hydrogen 1016.

Figure 5F:
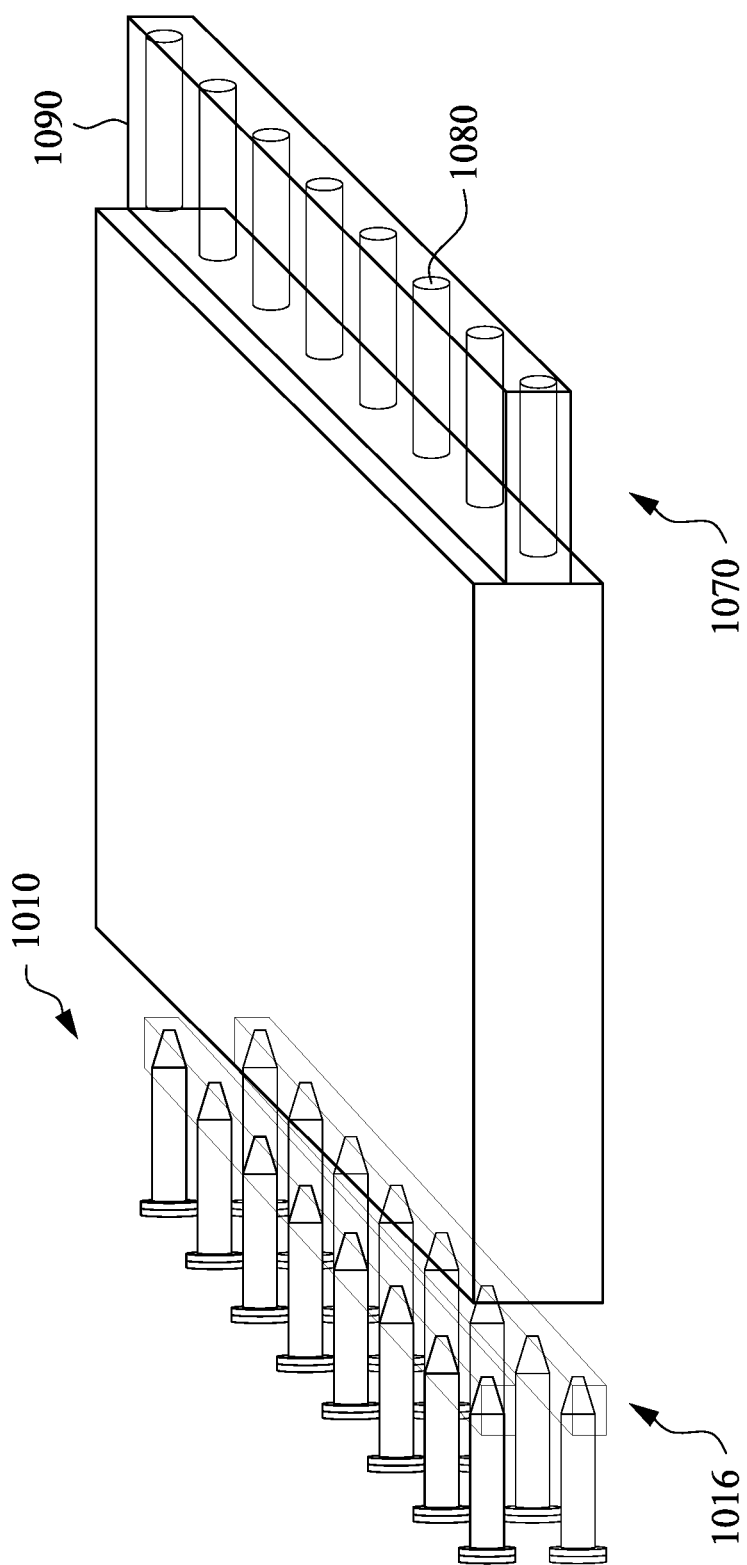
FIG. 5F is a schematic view of a plurality of nozzles and a plurality of exhaust nozzles according to embodiments of the disclosure.

As shown in FIG. 5F, in some embodiments, the exhaust nozzle 1070 includes a plurality of exhaust nozzles 1080. In some embodiments, the plurality of exhaust nozzles 1080 are arranged within an exhaust slit 1090. In some embodiments, the exhaust nozzle 1070 is configured to adjust a direction of the plurality of nozzles 1080 of the correcting nozzle arranged in the exhaust slit 1090 to adjust the flow of the hydrogen. In some embodiments, the plurality of exhaust nozzles 1080 are configured to adjust the trajectory of the hydrogen in combination with the correcting nozzle 1010.

Figure 6:
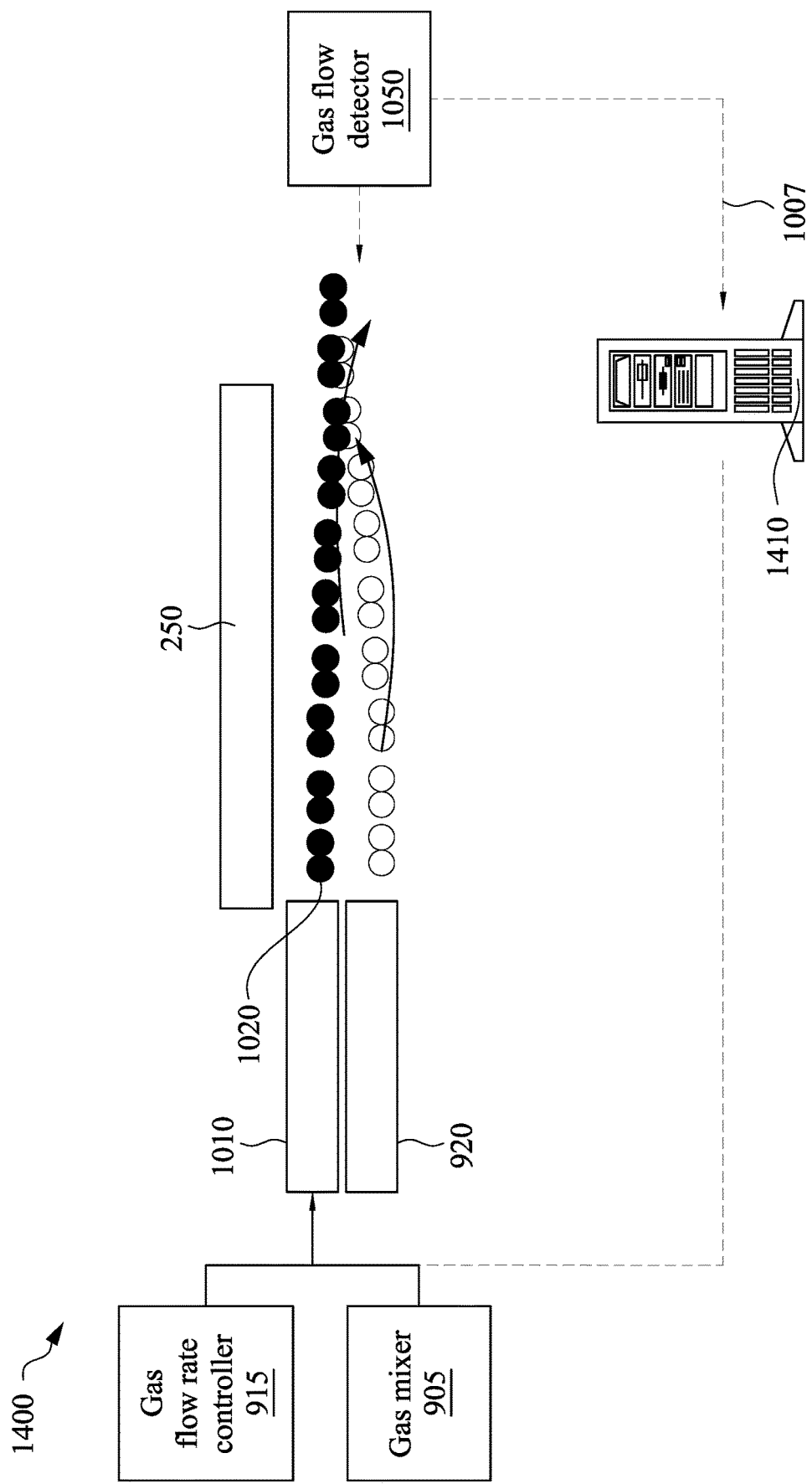
FIG. 6 shows a schematic of a feedback control system for controlling a process according to some embodiments of the present disclosure.

FIG. 6 shows an exemplary schematic view of an apparatus for reducing hydrogen permeation of the mask according to some embodiments of the present disclosure. In some embodiments, the corrected trajectory of the hydrogen using the at least one flow adjusting gas 1020 is measured by a gas flow detector 1050. In some embodiments, a variation in hydrogen flow corrected by the at least one flow adjusting gas 1020 is used as a feedback 1007 to a controller 1410 for adjusting a gas pressure from the correcting nozzle 1010. In some embodiments, the trajectory correcting assembly 1000 includes a plurality of purging gas including, for example, helium (He), neon (Ne), argon (Ar), deuterium ($D_2$) and/or nitrogen ($N_2$), and measures the variation in hydrogen flow corrected by the correcting nozzle 1010. The signal from the gas flow detector 1050 is used as a feedback for adjusting the gas pressure from the correcting nozzle 1010 in some embodiments. In some embodiments, the feedback may be connected with a gas mixer 905 to mix two or more of the at least one flow adjusting gas 1020 to adjust the hydrogen flow path below the mask based on a molecular weight. In some embodiments, the trajectory correcting assembly 1000 further includes a gas flow rate controller 915 configured to adjust the trajectory of the hydrogen away from the mask.

The feedback mechanism provided in some embodiments may further send a notification based on a hydrogen flow measurement information indicating the hydrogen flow measurement is within the acceptable hydrogen flow measurement range. In some embodiments, the notification includes a corrected hydrogen flow from the hydrogen nozzle using the correcting nozzle 1010. In some embodiments, the notification also includes a gas pressure of the one or more of the at least one flow adjusting gas 1020. In some embodiments, the notification also includes an angle of the correcting nozzle 1010 coupled to the reticle mini environment (RME 940 shown in FIG. 4B) adjacent to the reticle, in which the angle is between the correcting nozzle 1010 and the surface the reticle. In some embodiments, based on the generating the notification, the feedback further sends the notification to a first external device associated with the gas flow rate controller 915 and a second external device associated with a gas pressure controller.

In some embodiments, gas flows of the hydrogen and at least one flow adjusting gas are monitored by an airflow pattern recognition system 1500 (shown in FIGS. 7B and 7C) using one or more imaging or visualization techniques. Various air flow patterns with various gas flow conditions (gas kind, flow rate, gas speed, pressure, temperature, etc) are corrected and accumulated in a storage (memory) as gas flow pattern data. In some embodiments, hydrogen accumulation patterns are also obtained and stored. In some embodiments, correlations between one or more parameters of the gas flow conditions of the hydrogen gas and correcting gas are analyzed and obtained by using analytical methods, such as a machine learning method. In some embodiments, the gas flow pattern data are obtained before an EUV lithography operation for the actual wafer manufacturing process is performed. During the EUV lithography operation, the gas flow patterns of the hydrogen gas and the flow adjusting gas are monitored, and then compared with the accumulated gas flow pattern data. Based on the comparison, one or more of the gas flow parameters for the hydrogen gas and/or the correcting gas is adjusted.

Figure 7A:
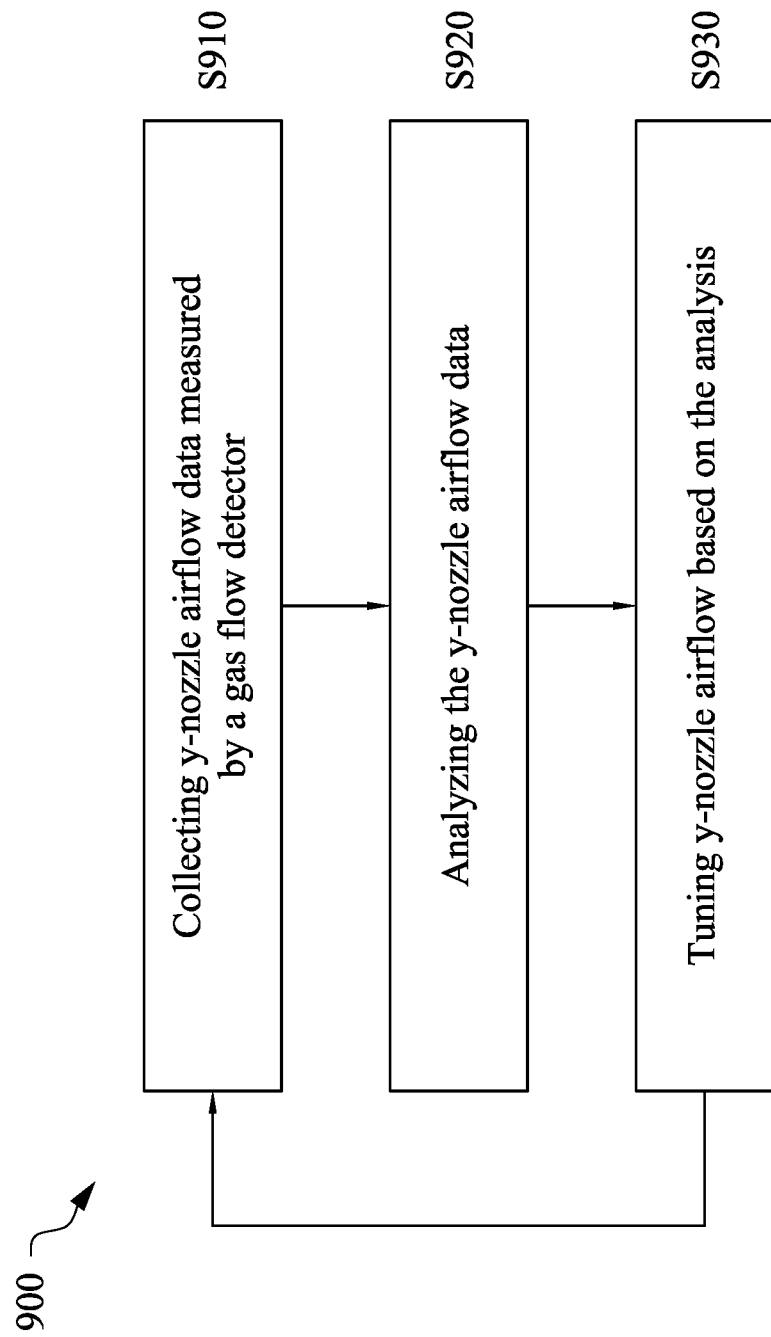
FIG. 7A illustrates a collect-analyze-tune (CAT) operation in accordance with some embodiments of the present disclosure.

FIG. 7A illustrates a collect-analyze-tune (CAT) operation 900 in accordance with some embodiments of the present disclosure. The CAT operation starts with collecting Y-nozzle airflow data measured by a gas flow detector, in operation S910. Then, in operation S920, the Y-nozzle airflow data is analyzed. Finally, in operation S930, Y-nozzle airflow is tuned based on the Y-nozzle airflow analysis. When analyzing the Y-nozzle airflow data, the trajectory correcting assembly 1000 uses various pattern recognition techniques such as machine learning, big data mining, and neural network.

Figure 7B:
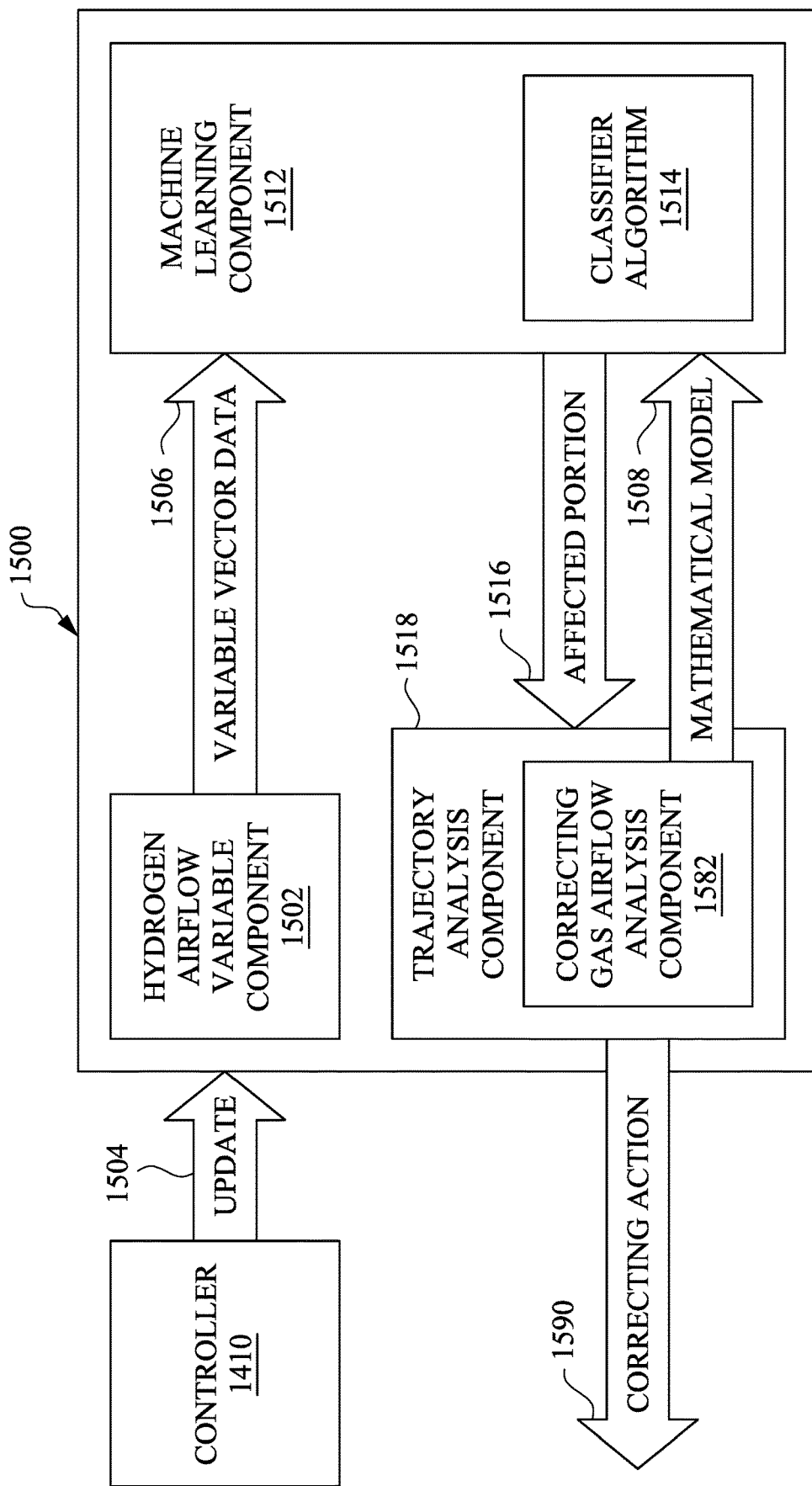
FIGS. 7B and 7C illustrate block diagrams of non-limiting examples of an airflow pattern recognition system in accordance with one or more embodiments described herein.
Figure 7C:
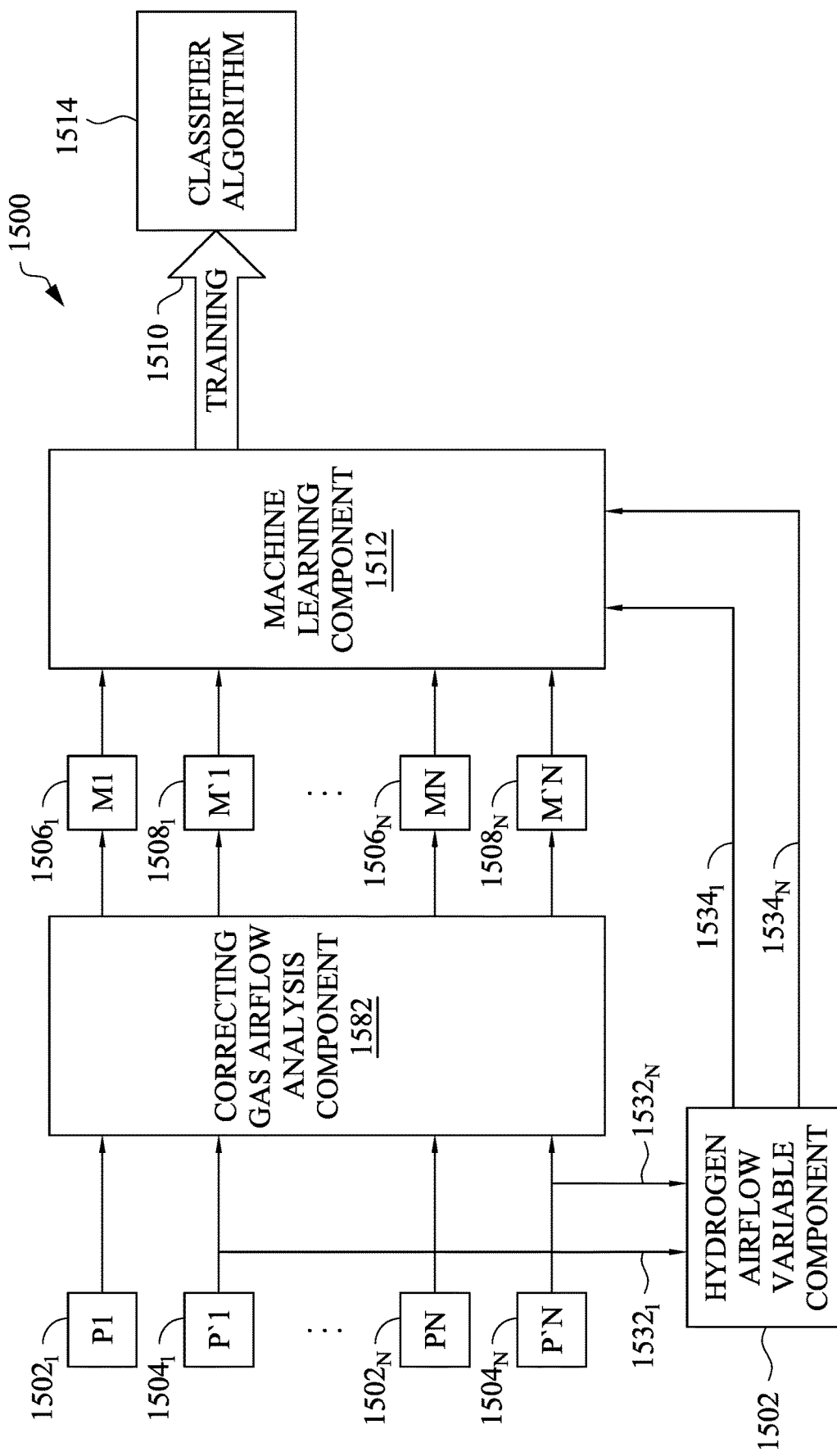

FIGS. 7B and 7C illustrate block diagrams of non-limiting examples of an airflow pattern recognition system 1500 in accordance with one or more embodiments described herein. As shown in FIG. 7B, the airflow pattern recognition system 1500 includes a hydrogen airflow variable component 1502 that receives an update 1504. The update 1504 includes a change or update to one or more parameters of the gas flow conditions associated with the hydrogen and the correcting gas, such as gas kind, flow rate, gas speed, pressure, and temperature, received from the controller 1410. In some embodiments, the controller 1410 is configured to update control variables to remove or mitigate a hydrogen permeation or vulnerability that was detected by the hydrogen airflow analysis to incorporate new correcting actions/elements 1590. In some embodiments, the update 1504 can be received from another suitable controller or database. In response to the update 1504, the hydrogen airflow variable component 1502 is configured to generate variable vector data 1506. The variable vector data 1506 mathematically represents the hydrogen airflow variable component 1502 mathematically, such as by a mathematical model.

The machine learning component 1512 is configured to receive the variable vector data 1506 from the hydrogen airflow variable component 1502, and employ a classifier algorithm 1514 (or another suitable classifier or machine learning technique) to identify an affected portion 1516. The affected portion 1516 includes a subset of a mathematical model that is affected by the update 1504. In some embodiments, the classifier algorithm 1514 and/or machine learning component 1512 can mark or tag the affected portion 1516 with a severity of the affected portion.

In some embodiments, the classifier algorithm 1514 is trained in advance. For example, the gas flow pattern data may be obtained and trained before the EUV lithography operation for the actual wafer manufacturing process is performed. Based on the training, the classifier algorithm 1514 is configured to learn how a particular variable (e.g., molecular weight) affects the mathematical model 1508 and/or how to adjust/remedy a trajectory in the context of mathematical model 1508. In some embodiments, the machine learning component 1512 is configured to identify the affected portion 1516 based on the variable vector data 1506.

The trajectory analysis component 1518 is configured to receive the affected portion 1516 or related information. The trajectory analysis component 1518 conducts a correcting gas airflow analysis 1582 based on the affected portion 1516. For example, the trajectory analysis component 1518 combines the correcting gas airflow analysis 1582 and the hydrogen airflow variable component 1502 on the mathematical model 1508 and determines a correcting action 1590 by machine learning techniques (e.g., classifier algorithm 1514) and represented by the affected portion 1516. In other words, based on machine learning, in some embodiments, the trajectory analysis component 1518 identifies the extent of the updates to mathematical model 1508 and how such updates can be provided.

In some embodiments, the trajectory analysis component 1518 is configured to generate one or more correcting actions. The correcting action 1590 represents a newly generated mathematical model 1508 that can be employed to remedy the affected portion 1516. By applying the correcting gas airflow analysis based on the hydrogen airflow analysis, a feedback is provided in real-time to generate a mathematical model 1508.

As shown in FIG. 7C, the airflow pattern recognition system 1500 includes the correcting gas airflow analysis component 1582 and the machine learning component 1512. The correcting gas airflow analysis component 1582 receives parameters P1 through PN ($1502_1$-$1502_N$) and updated parameters P'1 through P'N ($1504_1$-$1504_N$), where N is any positive integer. In some embodiments, the correcting gas airflow analysis component 1582 generates mathematical models M1 through MN (models $1506_1$-$1506_N$) and M'1 through M'N (models $1508_1$-$1508_N$) based on the received parameters $1502_1$-$1502_N$ and the updated parameters $1504_1$-$1504_N$, respectively, and send them to the machine learning component 1512.

In some embodiments, the machine learning component 1512 compares M1 and M'1 to identify how the model changes based on specific updates $1532_1$-$1532_N$. The hydrogen airflow variable component 1502 generates a variable vector data $1534_1$-$1534_N$ in view of the specific update $1532_1$-$1532_N$ to identify how the particular variables of variable vector data $1534_1$ affect M'1 relative to M1. In response, the machine learning component 1512 updates the classifier algorithm 1514 by conducting a training 1510. Accordingly, the machine learning component 1512 can identify how models (e.g., M1, MN, etc.) change relative to certain updates 1532 and how those models will change according to certain variables that are derived from the updates 1532 by hydrogen airflow variable component 1502. As a result, in some embodiments, the classifier algorithm 1514 is trained to learn the consequences of the correcting gas airflow analysis component 1582 based on the variables of the parameters P1 through PN ($1502_1$-$1502_N$).

Figure 8:
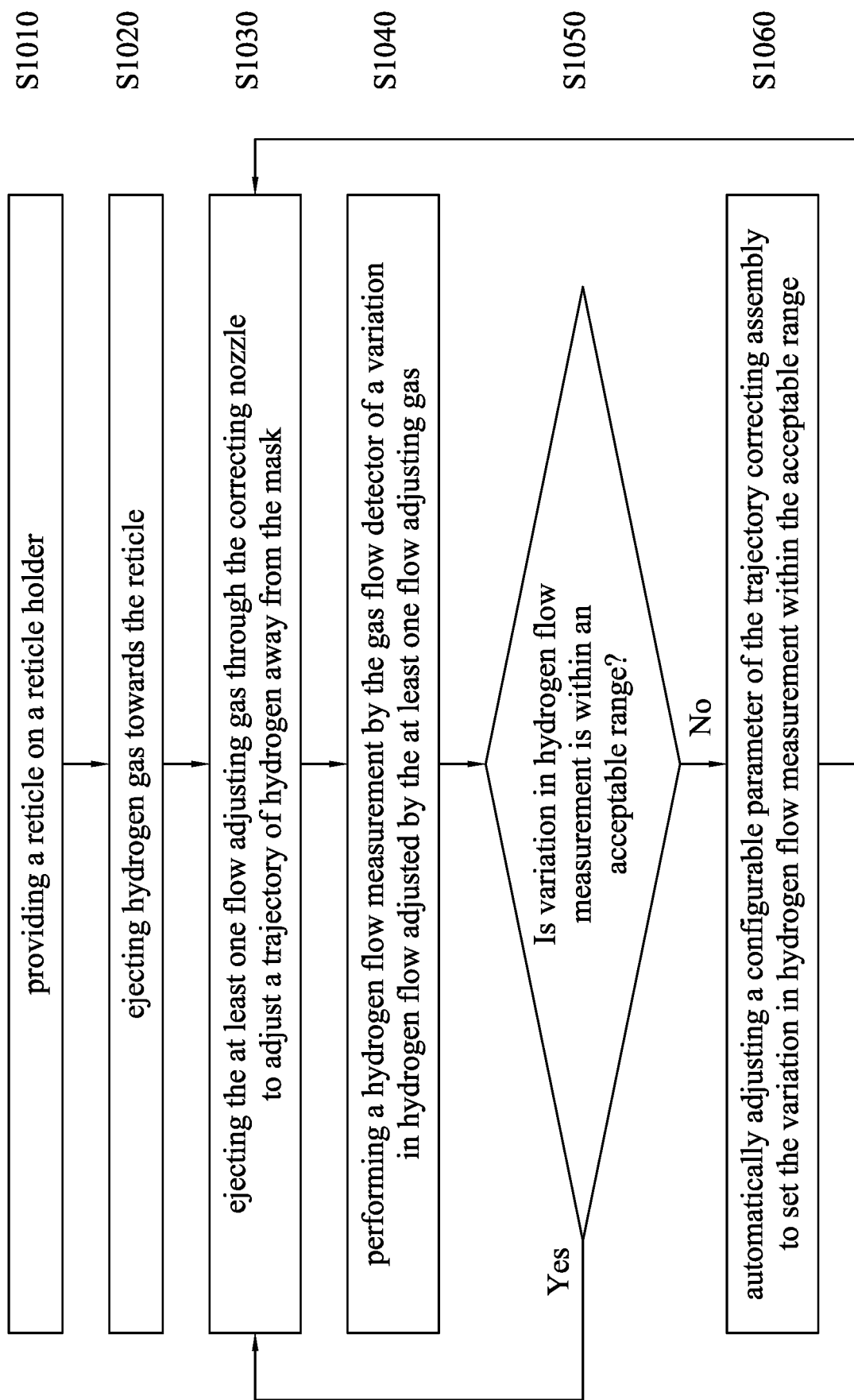
FIG. 8 shows a flow chart of a method of controlling a feedback system of an extreme ultraviolet (EUV) radiation source according to an embodiment of the disclosure.

FIG. 8 shows a flow chart of a method of controlling a feedback system of an extreme ultraviolet (EUV) radiation source according to an embodiment of the disclosure. The method includes, at S1010, providing a reticle on a reticle holder. At S1020, hydrogen gas is ejected towards the reticle. The trajectory correcting assembly includes a correcting nozzle and a gas flow detector. The correcting nozzle is configured to dispense at least one flow adjusting gas to adjust a trajectory of hydrogen away from the mask to reduce hydrogen permeation at an edge of the mask, and the gas flow detector is configured to measure a variation of an airflow of the hydrogen adjusted by the at least one flow adjusting gas. Then, at S1030, the at least one flow adjusting gas is ejected through the correcting nozzle to adjust a trajectory of hydrogen away from the mask. At S1040, a hydrogen flow measurement is performed by the gas flow detector of a variation in hydrogen flow adjusted by the at least one flow adjusting gas. Consequently, at S1050, it is determined whether a variation in hydrogen flow measurement is within an acceptable range. Finally, at 51060, in response to a variation in hydrogen flow measurement that is not within the acceptable range of variation in hydrogen flow measurement, a configurable parameter of the trajectory correcting assembly is automatically adjusted to set the variation in hydrogen flow measurement within the acceptable range.

Figure 9A:
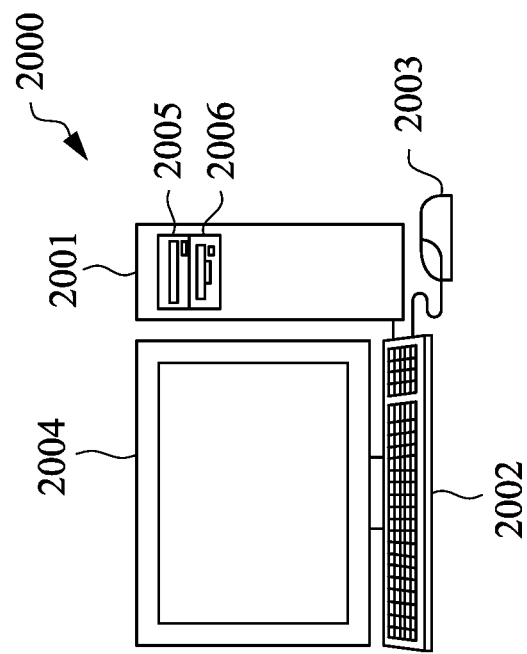
FIGS. 9A and 9B illustrate a controller in accordance with some embodiments of the disclosure.
Figure 9B:
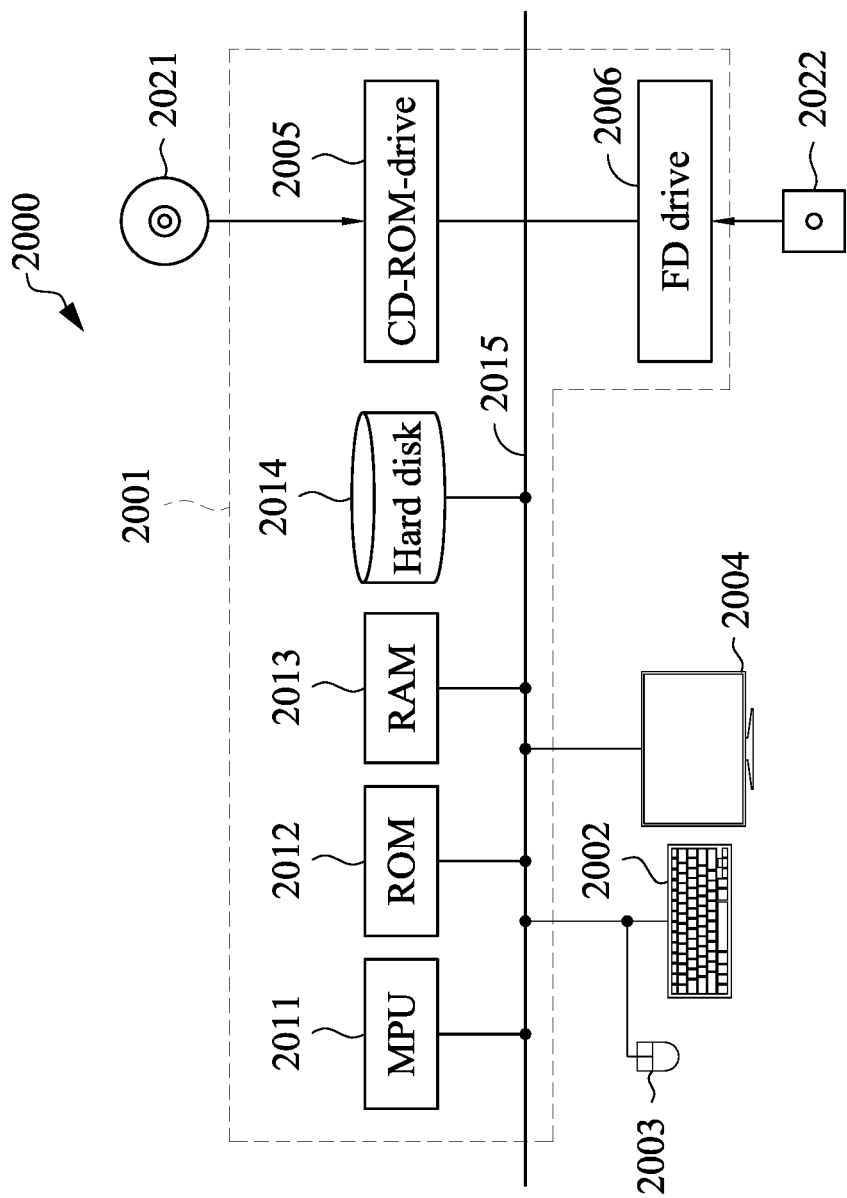

FIGS. 9A and 9B illustrate a configuration of the controller 1410 in accordance with some embodiments of the disclosure. In some embodiments, a computer system 2000 is used as the controller 1410. In some embodiments, the computer system 2000 performs the functions of the controller as set forth above.

FIG. 9A is a schematic view of a computer system. All of or a part of the processes, methods and/or operations of the foregoing embodiments can be realized using computer hardware and computer programs executed thereon. In FIG. 9A, a computer system 2000 is provided with a computer 2001 including an optical disk read only memory (e.g., CD-ROM or DVD-ROM) drive 2005 and a magnetic disk drive 2006, a keyboard 2002, a mouse 2003, and a monitor 2004.

FIG. 9B is a diagram showing an internal configuration of the computer system 2000. In FIG. 9B, the computer 2001 is provided with, in addition to the optical disk drive 2005 and the magnetic disk drive 2006, one or more processors, such as a micro processing unit (MPU) 2011, a ROM 2012 in which a program such as a boot up program is stored, a random access memory (RAM) 2013 that is connected to the MPU 2011 and in which a command of an application program is temporarily stored and a temporary storage area is provided, a hard disk 2014 in which an application program, a system program, and data are stored, and a bus 2015 that connects the MPU 2011, the ROM 2012, and the like. Note that the computer 2001 may include a network card (not shown) for providing a connection to a LAN.

The program for causing the computer system 2000 to execute the functions of an apparatus for controlling the apparatus in the foregoing embodiments may be stored in an optical disk 2021 or a magnetic disk 2022, which are inserted into the optical disk drive 2005 or the magnetic disk drive 2006, and transmitted to the hard disk 2014. Alternatively, the program may be transmitted via a network (not shown) to the computer 2001 and stored in the hard disk 2014. At the time of execution, the program is loaded into the RAM 2013. The program may be loaded from the optical disk 2021 or the magnetic disk 2022, or directly from a network. The program does not necessarily have to include, for example, an operating system (OS) or a third party program to cause the computer 2001 to execute the functions of the controller 1410 in the foregoing embodiments. The program may only include a command portion to call an appropriate function (module) in a controlled mode and obtain desired results.

In various embodiments, a correcting nozzle is provided to adjust a trajectory of the hydrogen away from the mask. Such correction prevents hydrogen permeation at the edge of the reticle (mask), thereby increasing the lifetime of the reticle and increasing the throughput of the EUV lithography system as well as reducing the cost of maintenance of the reticle.

It will be understood that not all advantages have been necessarily discussed herein, no particular advantage is required for all embodiments or examples, and other embodiments or examples may offer different advantages.

An embodiment of the disclosure is an apparatus for reducing hydrogen permeation of an extreme ultraviolet (EUV) mask. The apparatus includes a mask stage configured to hold the mask, a hydrogen dispensing nozzle configured to eject hydrogen below the mask, and a trajectory correcting assembly. The trajectory correcting assembly includes a correcting nozzle disposed between the mask stage and the hydrogen dispensing nozzle. The correcting nozzle is configured to dispense at least one flow adjusting gas different from hydrogen to adjust a trajectory of the hydrogen away from the mask to reduce hydrogen permeation at an edge of the mask.

In some embodiments, the apparatus further includes a gas flow detector configured to measure a variation of a flow of the hydrogen adjusted by the at least one flow adjusting gas. In some embodiments, the apparatus further includes a gas mixer configured to mix two or more of flow adjusting gases. In some embodiments, the apparatus further includes a gas flow rate controller configured to adjust the trajectory of the hydrogen away from the mask. In some embodiments, the apparatus further includes a plurality of exhaust nozzles configured to forcibly exhaust the hydrogen away from the mask. In some embodiments, the correcting nozzle includes a plurality of nozzles arranged in a slit.

Another embodiment of the disclosure is a method of manufacturing a semiconductor device. The method includes providing a reticle on a reticle holder. Hydrogen flows over the reticle and reticle holder. Then, a trajectory correcting assembly is provided that includes a correcting nozzle and a gas flow detector. The correcting nozzle is configured to dispense at least one flow adjusting gas to adjust a trajectory of the hydrogen away from the reticle to reduce hydrogen permeation at an edge of the reticle. The gas flow detector is configured to measure a variation of a flow of the hydrogen adjusted by the at least one flow adjusting gas. Subsequently, the at least one flow adjusting gas flows through the correcting nozzle to adjust a trajectory of hydrogen away from the reticle.

In some embodiments, Flows of the hydrogen and the at least one flow adjusting gas are then monitored. An then, the flow of the at least one flow adjusting gas is adjusted based on monitored results of the hydrogen and the at least one flow adjusting gas. In some embodiments, a hydrogen flow measurement is performed by the gas flow detector of a variation in hydrogen flow adjusted by the at least one flow adjusting gas. Then, it is determined whether a variation in hydrogen flow measurement is within an acceptable range. In response to a variation in hydrogen flow measurement that is not within the acceptable range of variation in hydrogen flow measurement, a configurable parameter of the trajectory correcting assembly is automatically adjusted to set the variation in hydrogen flow measurement within the acceptable range. In some embodiments, a pressure of a plurality of exhaust nozzles configured is adjusted to forcibly exhaust the hydrogen away from the reticle. In some embodiments, a direction of a plurality of nozzles of the correcting nozzle arranged in a slit is adjusted to adjust the flow of the hydrogen. In some embodiments, a flow rate of a gas flow rate controller is adjusted, in which the gas flow rate controller is configured to adjust the trajectory of the hydrogen away from the reticle. In some embodiments, a distance between a Y-nozzle for hydrogen and the correcting nozzle is adjusted in a range from 1 mm to 20 mm to adjust the flow of the hydrogen.

Another aspect of the present disclosure is a method of manufacturing a semiconductor device. The method includes proving an extreme ultraviolet (EUV) lithography system that includes a mask stage configured to hold a mask, a hydrogen dispensing nozzle configured to eject hydrogen below the mask, a trajectory correcting assembly, and a controller. The trajectory correcting assembly includes a correcting nozzle configured to dispense at least one flow adjusting gas to adjust a trajectory of the hydrogen away from the mask to reduce hydrogen permeation at an edge of the mask, and a gas flow detector configured to measure a variation of a flow of the hydrogen adjusted by the at least one flow adjusting gas. The controller is coupled to the trajectory correcting assembly. The method then includes, using the controller, determining whether the variation in hydrogen flow measurement at the gas flow detector is within an acceptable range. In response to a determination that the variation in hydrogen flow measurement is not within an acceptable range, the controller automatically adjusts a configurable parameter of the trajectory correcting assembly.

In some embodiments, a gas mixer is provided to mix two or more of flow adjusting gas based on a molecular weight. In some embodiments, the controller is configured to control the gas mixer to change the trajectory of one of or both the hydrogen nozzle and at least one flow adjusting gas. In some embodiments, the controller is configured to control an angle of the correcting nozzle with respect to a surface the mask stage facing the correcting nozzle. In some embodiments, the controller adjusts a gas pressure of the at least one flow adjusting gas. In some embodiments, a plurality of exhaust nozzles are provided to forcibly exhaust the hydrogen away from the mask. In some embodiments, the controller is configured to send a notification including a gas pressure of the hydrogen and the at least one flow adjusting gas.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for reducing hydrogen permeation of an extreme ultraviolet (EUV) mask, the apparatus comprising:
    a mask stage configured to hold the mask;
    a hydrogen dispensing nozzle configured to eject hydrogen below the mask; and
    a trajectory correcting assembly including a correcting nozzle disposed between the mask stage and the hydrogen dispensing nozzle, wherein the correcting nozzle is configured to dispense at least one flow adjusting gas different from hydrogen to adjust a trajectory of the hydrogen away from the mask by contacting a flow the hydrogen to reduce hydrogen permeation to the mask.

2. The apparatus of claim 1, further comprising a gas flow detector configured to measure a variation of a flow of the hydrogen adjusted by the at least one flow adjusting gas.

3. The apparatus of claim 1, further comprising a gas mixer configured to mix two or more of flow adjusting gases.

4. The apparatus of claim 1, further comprising a gas flow rate controller configured to adjust the trajectory of the hydrogen away from the mask.

5. The apparatus of claim 1, further comprising a plurality of exhaust nozzles configured to forcibly exhaust the hydrogen away from the mask.

6. The apparatus of claim 1, wherein the correcting nozzle includes a plurality of nozzles arranged in a slit.

7. A method of manufacturing a semiconductor device, the method comprising:
providing a reticle on a reticle holder;
flowing hydrogen over the reticle and reticle holder;
providing a trajectory correcting assembly, wherein the trajectory correcting assembly includes:
a correcting nozzle configured to dispense at least one flow adjusting gas different from hydrogen to adjust a trajectory of the hydrogen away from the reticle to reduce hydrogen permeation to the reticle; and
a gas flow detector configured to measure a variation of a flow of the hydrogen adjusted by the at least one flow adjusting gas; and
flowing the at least one flow adjusting gas through the correcting nozzle to adjust a trajectory of hydrogen away from the reticle by contacting the flow of the hydrogen.

8. The method according to claim 7, further including:
monitoring flows of the hydrogen and the at least one flow adjusting gas; and
adjusting the flow of the at least one flow adjusting gas based on monitored results of the hydrogen and the at least one flow adjusting gas.

9. The method according to claim 7, further including:
performing a hydrogen flow measurement by the gas flow detector of a variation in hydrogen flow adjusted by the at least one flow adjusting gas;
determining whether a variation in hydrogen flow measurement is within an acceptable range; and
in response to a variation in hydrogen flow measurement that is not within the acceptable range of variation in hydrogen flow measurement, automatically adjusting a configurable parameter of the trajectory correcting assembly to set the variation in hydrogen flow measurement within the acceptable range.

10. The method according to claim 9, further including:
adjusting a pressure of a plurality of exhaust nozzles configured to forcibly exhaust the hydrogen away from the reticle.

11. The method according to claim 9, further including:
adjusting a direction of a plurality of nozzles of the correcting nozzle arranged in a slit to adjust the flow of the hydrogen.

12. The method according to claim 9, further including:
adjusting a flow rate of a gas flow rate controller configured to adjust the trajectory of the hydrogen away from the reticle.

13. The method of claim 9, further comprising:
adjusting a distance between a Y-nozzle for hydrogen and the correcting nozzle in a range from 1 mm to 20 mm to adjust the flow of the hydrogen.

14. A method of manufacturing a semiconductor device, the method comprising:
providing extreme ultraviolet (EUV) lithography system, wherein the EUV lithography system includes:
a mask stage configured to hold a mask;
a hydrogen dispensing nozzle configured to eject hydrogen below the mask;
a trajectory correcting assembly including:
a correcting nozzle configured to dispense at least one flow adjusting gas to adjust a trajectory of the hydrogen away from the mask to reduce hydrogen permeation at an edge of the mask; and
a gas flow detector configured to measure a variation of a flow of the hydrogen adjusted by the at least one flow adjusting gas; and
a controller coupled to the trajectory correcting assembly,
determining, by the controller, whether the variation in hydrogen flow measurement at the gas flow detector is within an acceptable range, and
adjusting, by the controller, in response to a determination that the variation in hydrogen flow measurement is not within an acceptable range, a configurable parameter of the trajectory correcting assembly.

15. The method of claim 14, further including:
providing a gas mixer configured to mix two or more of flow adjusting gas based on a molecular weight.

16. The method of claim 15, wherein the controller is configured to control the gas mixer to change the trajectory of one of or both the hydrogen nozzle and at least one flow adjusting gas.

17. The method of claim 14, wherein the controller is configured to control an angle of the correcting nozzle with respect to a surface of the mask stage facing the correcting nozzle.

18. The method of claim 14, further including:
adjusting, by the controller, a gas pressure of the at least one flow adjusting gas.

19. The method of claim 14, further including:
proving a plurality of exhaust nozzles configured to forcibly exhaust the hydrogen away from the mask.

20. The method of claim 14, wherein the controller is configured to send a notification including a gas pressure of the hydrogen and the at least one flow adjusting gas.

* * * * *